(12) United States Patent
Sudo

(10) Patent No.: US 8,816,337 B2
(45) Date of Patent: Aug. 26, 2014

(54) DISPLAY APPARATUS AND IMAGE PICKUP APPARATUS

(75) Inventor: Shoji Sudo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 71 days.

(21) Appl. No.: 13/595,839

(22) Filed: Aug. 27, 2012

(65) Prior Publication Data

US 2013/0048969 A1    Feb. 28, 2013

(30) Foreign Application Priority Data

Aug. 31, 2011    (JP) .................................. 2011-189132

(51) Int. Cl.
*H01L 29/08* (2006.01)
(52) U.S. Cl.
USPC ................................ 257/40; 257/89; 257/102
(58) Field of Classification Search
CPC ......... H01L 51/00; H01L 51/50; H01L 51/52; H01L 51/56; H01L 51/5004; H01L 51/5008; H01L 51/5024; H01L 51/5028
USPC ....................................... 257/40, 89, 102, 103
See application file for complete search history.

(56) References Cited

U.S. PATENT DOCUMENTS

| | | | |
|---|---|---|---|
| 2006/0105201 A1* | 5/2006 | Lee et al. ....................... | 428/690 |
| 2009/0296366 A1* | 12/2009 | Shikina et al. ................... | 362/19 |
| 2011/0108810 A1* | 5/2011 | Kishino .......................... | 257/40 |

FOREIGN PATENT DOCUMENTS

| | | |
|---|---|---|
| JP | 2007-066862 A | 3/2007 |
| JP | 2007-234241 A | 9/2007 |

* cited by examiner

*Primary Examiner* — Shaun Campbell
(74) *Attorney, Agent, or Firm* — Canon U.S.A., Inc., IP Division

(57) ABSTRACT

A first light-emitting layer of a first organic electroluminescent element is disposed in common to a second organic electroluminescent element, a second light-emitting layer of the second organic electroluminescent element is disposed in contact with the first light-emitting layer and in the cathode side, and the first light-emitting layer contains a host material and an assist dopant material to transport holes to the second light-emitting layer.

14 Claims, 5 Drawing Sheets

DISPLAY APPARATUS AND IMAGE PICKUP APPARATUS

BACKGROUND OF THE INVENTION

1. Field of the Invention

The present invention relates to a display apparatus provided with an organic electroluminescent element.

2. Description of the Related Art

The organic electroluminescent element has been developed actively in recent years and has a configuration in which an anode, an organic compound containing at least a light-emitting layer, and a cathode are stacked. Regarding a general method for manufacturing a multicolor display apparatus including organic electroluminescent elements of three colors, red, green, and blue, each of light-emitting layers of red, green, and blue is vacuum-evaporated by using a metal mask for patterning in accordance with the pixel shape of the color concerned.

The pixel size of the display apparatus has been reduced, and a high degree of accuracy has been required with respect to the metal mask for patterning in accordance with the pixel shape. As a result, production and maintenance of a metal mask with a high degree of accuracy have become difficult.

Japanese Patent Laid-Open No. 2007-066862 discloses a configuration in which a blue light-emitting layer is disposed all over a pixel region and a red light-emitting layer and a green light-emitting layer are disposed while being stacked as layers on the blue light-emitting layer. It is stated that the blue light-emitting layer is formed all over the pixel region without using a high-accuracy mask, so as to reduce the number of usage of the metal mask for patterning and, in addition, the life of the display apparatus can be improved by increasing a blue pixel area having a low luminous efficacy.

SUMMARY OF THE INVENTION

In the above-described configuration, regarding the red and the green organic electroluminescent elements, it is necessary that the blue light-emitting layer disposed all over the pixel region is not allowed to emit light, but only the red and the green light-emitting layers stacked are allowed to emit light. However, in some cases, electrons pass through the red light-emitting layer and the green light-emitting layer depending on the configurations of the red light-emitting layer and the green light-emitting layer, the electrons are leaked to the blue light-emitting layer, the blue light-emitting layer is allowed to emit light and, thereby, it becomes difficult to allow the red light-emitting layer and the green light-emitting layer to emit light efficiently.

Furthermore, Japanese Patent Laid-Open No. 2007-066862 discloses that electron block layers may be disposed between the red light-emitting layer and the blue light-emitting layer and between the green light-emitting layer and the blue light-emitting layer. However, regarding the configuration in which a charge block layer, e.g., the electron block layer, is disposed, the drive voltage of the element increases.

Aspects of the present invention provide a display apparatus including a light-emitting layer disposed in common to organic electroluminescent elements to emit different colors, wherein the individual organic electroluminescent elements are allowed to emit light efficiently without disposing a charge block layer between light-emitting layers.

An aspect of the present invention is a display apparatus including a first organic electroluminescent element to emit a first color and a second organic electroluminescent element to emit a second color different from the above-described first color, the above-described organic electroluminescent element being provided with an anode, a cathode, and a light-emitting layer disposed between the above-described anode and the above-described cathode, wherein a first light-emitting layer of the above-described first organic electroluminescent element is disposed in common to the above-described second organic electroluminescent element, a second light-emitting layer of the above-described second organic electroluminescent element is disposed in contact with the above-described first light-emitting layer and in the side nearer to the above-described cathode than is the above-described first light-emitting layer, the above-described first light-emitting layer contains a host material and an assist dopant material to transport holes to the above-described second light-emitting layer, and the above-described second organic electroluminescent element is configured to satisfy Relational expressions (1) to (3) described below, $$|HOMO_1| > |A| \tag{1}$$

$$|HOMO_1| > |HOMO_2| \tag{2}$$

$$|A| + |HOMO_2| - |HOMO_1| < |HOMO_a| < |HOMO_1| \tag{3}$$

where $HOMO_1$ represents the HOMO level energy of the above-described host material contained in the above-described light-emitting layer, $HOMO_a$ represents the HOMO level energy of the above-described assist dopant material contained in the above-described first light-emitting layer, $HOMO_2$ represents the HOMO level energy of the above-described second light-emitting layer, and A represents a work function of the above-described anode in the case where the above-described first light-emitting layer is in contact with the above-described anode or the HOMO level energy of an organic compound layer in the case where the above-described organic compound layer is disposed between the above-described first light-emitting layer and the above-described anode while being in contact with the above-described first light-emitting layer.

Another aspect of the present invention is a display apparatus including a first organic electroluminescent element to emit a first color and a second organic electroluminescent element to emit a second color different from the first color, the above-described organic electroluminescent element being provided with an anode, a cathode, and a light-emitting layer disposed between the above-described anode and the above-described cathode, wherein a first light-emitting layer of the above-described first organic electroluminescent element is disposed in common to the above-described second organic electroluminescent element, a second light-emitting layer of the above-described second organic electroluminescent element is disposed in contact with the above-described first light-emitting layer and in the side nearer to the above-described anode than is the above-described first light-emitting layer, the above-described first light-emitting layer contains a host material and an assist dopant material to transport electrons to the above-described second light-emitting layer, and the above-described second organic electroluminescent element is configured to satisfy Relational expressions (4) to (6) described below, $$|LUMO_1| < |B| \tag{4}$$

$$|LUMO_1| < |LUMO_2| \tag{5}$$

$$|LUMO_1| < |LUMO_a| < |B| + |LUMO_2| - |LUMO_1| \tag{6}$$

where $LUMO_1$ represents the LUMO level energy of the above-described host material contained in the above-described first light-emitting layer, $LUMO_a$ represents the LUMO level energy of the above-described assist dopant material contained in the above-described first light-emitting layer, $LUMO_2$ represents the LUMO level energy of the above-described second light-emitting layer, and B represents a work function of the above-described cathode in the case where the above-described first light-emitting layer is in contact with the above-described cathode or the LUMO level energy of an organic compound layer in the case where the above-described organic compound layer is disposed between the above-described first light-emitting layer and the above-described cathode while being in contact with the above-described first light-emitting layer.

According to aspects of the present invention, regarding a display apparatus including a light-emitting layer disposed in common to organic electroluminescent elements to emit different colors, the individual organic electroluminescent elements are allowed to emit light efficiently without disposing a charge block layer between light-emitting layers.

Further features of the present invention will become apparent from the following description of exemplary embodiments with reference to the attached drawings.

DESCRIPTION OF THE EMBODIMENTS

Figure 1A:
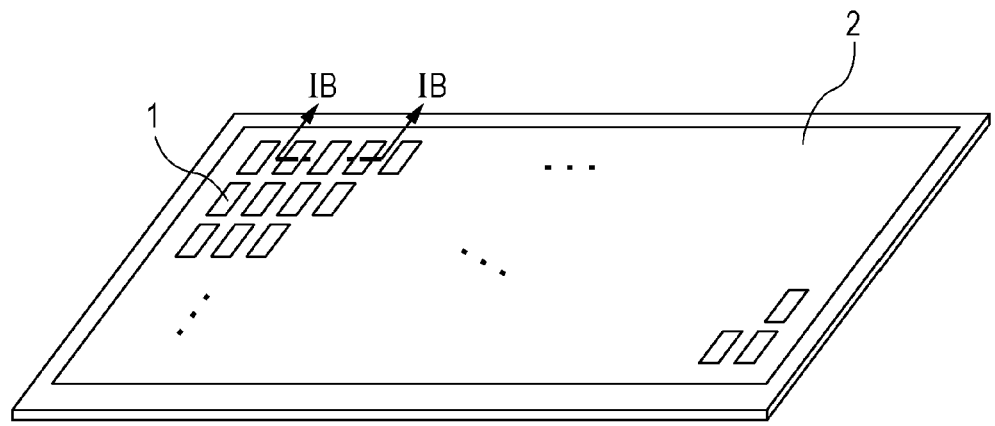
FIGS. 1A and 1B are schematic diagrams showing an example of a display apparatus according to a first embodiment.

A display apparatus according to aspects of the present invention will be described below on the basis of embodiments with reference to the drawings. Regarding the portions not specifically shown in the drawings or described in the present specification, well-known or publicly known technologies in the related art are applied. The embodiments explained below are no more than examples, and the present invention is not limited to them.

In particular, in the following embodiments, a first color, a second color, and a third color are specified to be blue, red, and green, respectively. A first organic electroluminescent element, a second organic electroluminescent element, and a third organic electroluminescent element are specified to be a blue organic electroluminescent element, a red organic electroluminescent element, and a green organic electroluminescent element. A first light-emitting layer, a second light-emitting layer, and a third light-emitting layer are specified to be a blue light-emitting layer, a red light-emitting layer, and a green light-emitting layer, respectively. However, the present invention is not limited to this configuration.

FIG. 1A is a schematic perspective diagram showing a display apparatus according to a first embodiment. The display apparatus according to the present embodiment includes a plurality of pixels 1 provided with an organic electroluminescent element. The plurality of pixels 1 are arranged in the matrix, so as to constitute a display region 2. In this regard, the pixel refers to a region corresponding to a light-emitting region of one light-emitting element. In the display apparatus according to the present embodiment, the light-emitting element is an organic electroluminescent element and one color of organic electroluminescent element is disposed in each pixel 1. Examples of colors emitted from the organic electroluminescent element include red, green, blue, yellow, cyan, magenta, and white. In the display apparatus according to the present embodiment, a plurality of pixel units formed from a plurality of pixels having different emission colors (for example, a pixel to emit red, a pixel to emit green, and a pixel to emit blue) are arranged. The pixel unit refers to a minimum unit which can emit a predetermined color through color mixing of the individual pixels.

Figure 1B:
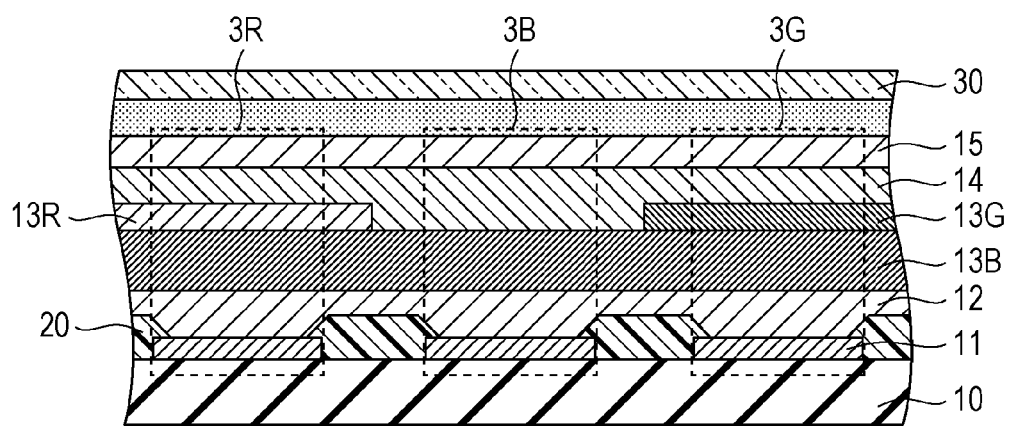

FIG. 1B is a schematic partial sectional diagram along a line IB-IB shown in FIG. 1A. The pixel 1 is formed from an organic electroluminescent element 3R (3G, 3B) provided with an anode 11, a hole transportation layer 12, a light-emitting layer 13R (13G, 13B) containing an organic compound, an electron transportation layer 14, and a cathode 15 on a substrate 10. The organic electroluminescent element 3R is an organic electroluminescent element to emit red and the red light-emitting layer 13R in the element emits light. Likewise, the organic electroluminescent elements 3G and 3B are an organic electroluminescent element to emit green and an organic electroluminescent element to emit blue, respectively, and the green light-emitting layer 13G and the blue light-emitting layer 13B, respectively, in the elements emit light.

The anode 11 is disposed separately from the anodes 11 of adjacent pixels, and an insulating layer 20 is disposed between pixels (more concretely, anodes 11) in order to prevent an occurrence of short-circuit with the cathode 15 due to a foreign substance. The hole transportation layer 12, the electron transportation layer 14, and the cathode 15 may be disposed in common to the adjacent pixels, as shown in FIG. 1B, or be disposed on a pixel basis through patterning.

The individual organic electroluminescent elements are sealed with a seal cap 30 in such a way that external oxygen and moisture do not enter. A desiccant is included in the inside of the seal cap 30.

In the present embodiment, the blue light-emitting layer 13B of the blue organic electroluminescent element 3B is integrally disposed over the regions of the organic electroluminescent elements 3R and 3G and, therefore, the blue light-emitting layer 13B serves as a so-called common light-emitting layer. According to this configuration, the number of usage of a high-accuracy metal mask for patterning the light-emitting layer can be reduced.

Furthermore, in the red organic electroluminescent element 3R, the red light-emitting layer 13R is disposed in contact with the blue light-emitting layer 13B and in the cathode 15 side. Likewise, in the green organic electroluminescent element 3G, the green light-emitting layer 13G is disposed in contact with the blue light-emitting layer 13B and in the cathode 15 side. That is, in the configuration of the present embodiment, a charge block layer is not disposed between the red light-emitting layer 13R and the blue light-emitting layer 13B serving as the common light-emitting layer nor between the green light-emitting layer 13G and the blue light-emitting layer 13B serving as the common light-emitting layer. Consequently, the drive voltage of the organic electroluminescent element does not increase.

In order to allow the red organic electroluminescent element 3R and the green organic electroluminescent element 3G to emit light efficiently even in the configuration in which a charge block layer is not disposed, the configuration of the blue light-emitting layer 13B is devised. That is, in the present embodiment, the blue light-emitting layer 13B contains a host material and an assist dopant material to transport holes to the light-emitting layers 13R and 13G. Furthermore, the red organic electroluminescent element 3R (or the green organic electroluminescent element 3G) is configured to satisfy Relational expressions (1) to (3) described below, $$|HOMO_1| > |A| \tag{1}$$

$$|HOMO_1| > |HOMO_2| \tag{2}$$

$$|A| + |HOMO_2| - |HOMO_1| < |HOMO_a| < |HOMO_1| \tag{3}$$

where $HOMO_1$ represents the highest occupied molecular orbital (HOMO) level energy of the host material contained in the blue light-emitting layer 13B, and $HOMO_a$ represents the HOMO level energy of the assist dopant material contained in the blue light-emitting layer 13B, $HOMO_2$ represents the HOMO level energy of the red light-emitting layer 13R (or the green light-emitting layer 13G), and A represents a work function of the anode 11 in the case where the blue light-emitting layer 13B is in contact with the anode 11 or the HOMO level energy of an organic compound layer in the case where the organic compound layer is disposed between the blue light-emitting layer 13B and the anode 11 while being in contact with the blue light-emitting layer 13B.

More concretely, the red organic electroluminescent element 3R is configured to satisfy Relational expressions (1), (2)', and (3)' described below, and the green organic electroluminescent element 3G is configured to satisfy Relational expressions (1), (2)", and (3)" described below, $$|HOMO_1| > |A| \tag{1}$$

$$|HOMO_1| > |HOMO_{22}| \tag{2}'$$

$$|A| + |HOMO_{22}| - |HOMO_1| < |HOMO_a| < |HOMO_1| \tag{3}'$$

$$|HOMO_1| > |HOMO_{23}| \tag{2}''$$

$$|A| + |HOMO_{23}| - |HOMO_1| < |HOMO_a| < |HOMO_1| \tag{3}''$$

where $HOMO_{22}$ represents the HOMO level energy of the red light-emitting layer 13R and $HOMO_{23}$ represents the HOMO level energy of the green light-emitting layer 13G.

The HOMO level energy of the red light-emitting layer 13R (or green light-emitting layer 13G) refers to the HOMO level energy having a smallest absolute value among the HOMO level energy of materials contained in the red light-emitting layer 13R (or green light-emitting layer 13G). For example, in the case where the red light-emitting layer 13R (or green light-emitting layer 13G) is made from only a light-emitting material, the HOMO level energy of the light-emitting material applies. In the case where the red light-emitting layer 13R (or green light-emitting layer 13G) is made from a host material and a light-emitting dopant material, the HOMO level energy of the red light-emitting layer 13R (or green light-emitting layer 13G) is the HOMO level energy of the host material or the HOMO level energy of the light-emitting dopant material, whichever has a smaller absolute value. In the case where the organic compound layer is made from only one material, the HOMO level energy of the organic compound layer refers to the HOMO level energy of the material concerned. In the case where the organic compound layer is made from at least two materials, the HOMO level energy of the organic compound layer refers to the HOMO level energy of the material having the largest content.

Figure 2A:
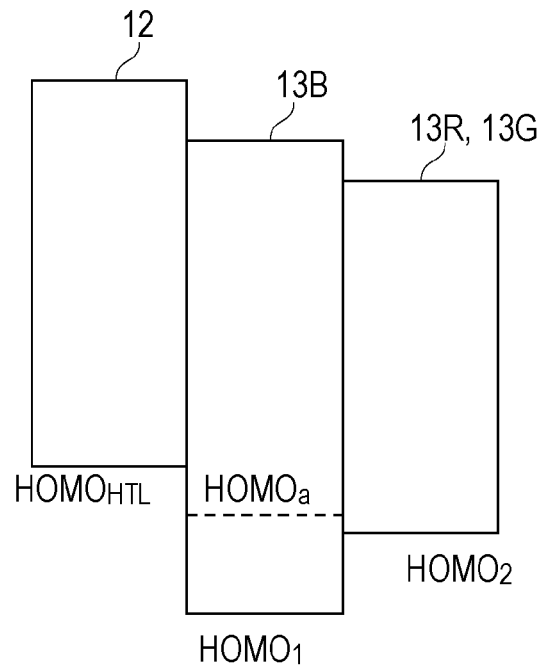
FIGS. 2A and 2B are schematic diagrams showing energy bands of the individual light-emitting layers according to the first embodiment.
Figure 2B:
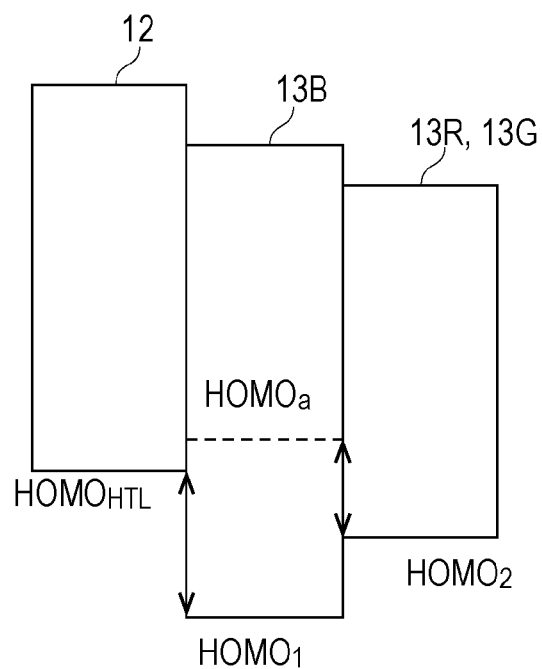

The above-described relational expressions will be explained with reference to FIGS. 2A and 2B. FIGS. 2A and 2B show energy bands of the blue light-emitting layer 13B and the red light-emitting layer 13R (or green light-emitting layer 13G) satisfying Relational expressions (1) to (3). FIGS. 2A and 2B show the case where a hole transportation layer 12 is disposed between the blue light-emitting layer 13B and the anode 11 while being in contact with the blue light-emitting layer 13B, and A is specified to be $HOMO_{HTL}$.

In order that the red organic electroluminescent element 3R (or green organic electroluminescent element 3G) emits light efficiently, it may be necessary that holes and electrons are injected into the red light-emitting layer 13R (or green light-emitting layer 13G) efficiently. Here, consideration is given to the case where the absolute value of the HOMO level energy of the blue light-emitting layer 13B is larger than the absolute value of the HOMO level energy of the hole transportation layer 12 and the absolute value of the HOMO level energy of the red light-emitting layer 13R (or green light-emitting layer 13G), as shown in FIG. 2A ($|HOMO_1| > |A|$, $|HOMO_1| > |HOMO_2|$). In this case, a hole injection barrier (difference in HOMO level energy between the blue light-emitting layer 13B and the hole transportation layer 12) occurs at the interface between the blue light-emitting layer 13B and the hole transportation layer 12, so that holes are not injected into the blue light-emitting layer 13B easily. As a result, holes are not injected into the red light-emitting layer 13R (or green light-emitting layer 13G) easily by being transported through the blue light-emitting layer 13B. Consequently, the red organic electroluminescent element 3R (or green organic electroluminescent element 3G) does not emit light efficiently.

Meanwhile, in the case where the assist dopant material to transport holes is mixed into the blue light-emitting layer 13B, holes are injected at the HOMO level of the assist dopant material of the blue light-emitting layer 13B, and are injected into the red light-emitting layer 13R (or green light-emitting layer 13G) from that level. As a result, the red organic electroluminescent element 3R (or green organic electroluminescent element 3G) emits light efficiently.

Consequently, it may be necessary that the absolute value of the HOMO level energy of the assist dopant material is smaller than the absolute value of the HOMO level energy of the host material of the blue light-emitting layer 13B.

Therefore, it may be necessary that $$|HOMO_a| < |HOMO_1| \tag{3A}$$

is satisfied.

Meanwhile, as shown in FIG. 2B, the absolute value of the HOMO level energy of the assist dopant material may be smaller than the absolute value of the HOMO level energy of the hole transportation layer 12. However, it may be necessary that holes injected at the HOMO level of the assist dopant material cross the hole injection barrier described below in order to be injected at the HOMO level of the red light-emitting layer 13R (or green light-emitting layer 13G). This hole injection barrier is represented by a difference in HOMO level energy between the assist dopant material and the red light-emitting layer 13R (or green light-emitting layer 13G). If this hole injection barrier is larger than the hole injection barrier represented by the originally expected difference in HOMO level energy between the blue light-emitting layer 13B and the hole transportation layer 12, it is not possible to obtain an effect by mixing the assist dopant material. Therefore, it may be necessary that the difference in HOMO level energy between the assist dopant material and the red light-emitting layer 13R (or green light-emitting layer 13G) is smaller than the difference in HOMO level energy between the blue light-emitting layer 13B and the hole transportation layer 12. Consequently, it may be necessary that $$||HOMO_2|-|HOMO_a||<||HOMO_1|-|A|| \quad (3B)$$

is satisfied.

Then, Relational expression (3) is derived from Formula (3A) and Formula (3B) described above.

As described above, the performance of injection of holes into the red light-emitting layer 13R (or green light-emitting layer 13G) is improved by the common light-emitting layer (blue light-emitting layer 13B) and red light-emitting layer 13R (or green light-emitting layer 13G) satisfying Relational expressions (1) to (3) described above. As a result, the probability of recombination of holes and electrons in the red light-emitting layer 13R (or green light-emitting layer 13G) increases and the organic electroluminescent elements 3R and 3G are allowed to emit light efficiently through the use of the recombination energy. In this regard, in the red organic electroluminescent element 3R and the green organic electroluminescent element 3G, the common light-emitting layer does not emit light in spite of being called a common light-emitting layer. That is, in the red organic electroluminescent element 3R, only the red light-emitting layer 13R emits light and in the green organic electroluminescent element 3G, only the green light-emitting layer 13G emits light. In the present invention, the term "do not emit light" refers to emit completely no light or emit light having intensity only at a level at which the intensity is not visually identified.

The blue light-emitting layer 13B according to the present embodiment contains a blue light emitting dopant material besides the host material and the assist dopant material. The light emitting dopant material may be 10 percent by weight or less in the components contained in the blue light-emitting layer 13B. This is because if the concentration of the light emitting dopant material is more than 10 percent by weight, the luminous efficacy may be reduced on the basis of concentration quenching. In order to transport holes efficiently, the concentration of the assist dopant material can be larger than the concentration of the light-emitting dopant material and be smaller than the concentration of the host material. More concretely, the concentration of the assist dopant material is 15 percent by weight or more and 45 percent by weight or less, such as 25 percent by weight or more and 45 percent by weight or less.

In particular, in the case where an anthracene derivative is used as the host material of the blue light-emitting layer 13B in the present embodiment, an effect obtained by introducing the assist dopant is significant. Regarding the blue organic electroluminescent element 3B including an anthracene derivative as a host material of the blue light-emitting layer 13B, a high luminous efficacy is ascertained, and it is believed that an effect is exerted on reduction in power consumption of a display apparatus or the like. However, most of anthracene derivatives satisfying the condition as the host material of the blue light-emitting layer 13B have large absolute values of the HOMO level energy, so that the hole injection barrier from the hole transportation layer 12 is large. Consequently, regarding the configuration in which the blue light-emitting layer 13B is disposed as a common light-emitting layer, as in the present embodiment, holes are not injected up to the adjacent red light-emitting layer 13R and green light-emitting layer 13G easily and the red light-emitting layer 13R and the green light-emitting layer 13G may not emit light efficiently. Therefore, regarding the blue light-emitting layer 13B including the anthracene derivative as a host material, a significant effect is obtained by introducing the assist dopant material.

Examples of the anthracene derivatives used as the host material of the blue light-emitting layer 13B include derivatives having at least one of structures represented by the structural formulae Compound 1 to Compound 4 in a skeleton, although the present invention is not limited to them. The absolute values of the HOMO level energy of Compounds 1, 2, 3, and 4 are 5.89 eV, 5.88 eV, 5.76 eV, and 5.86 eV, respectively.

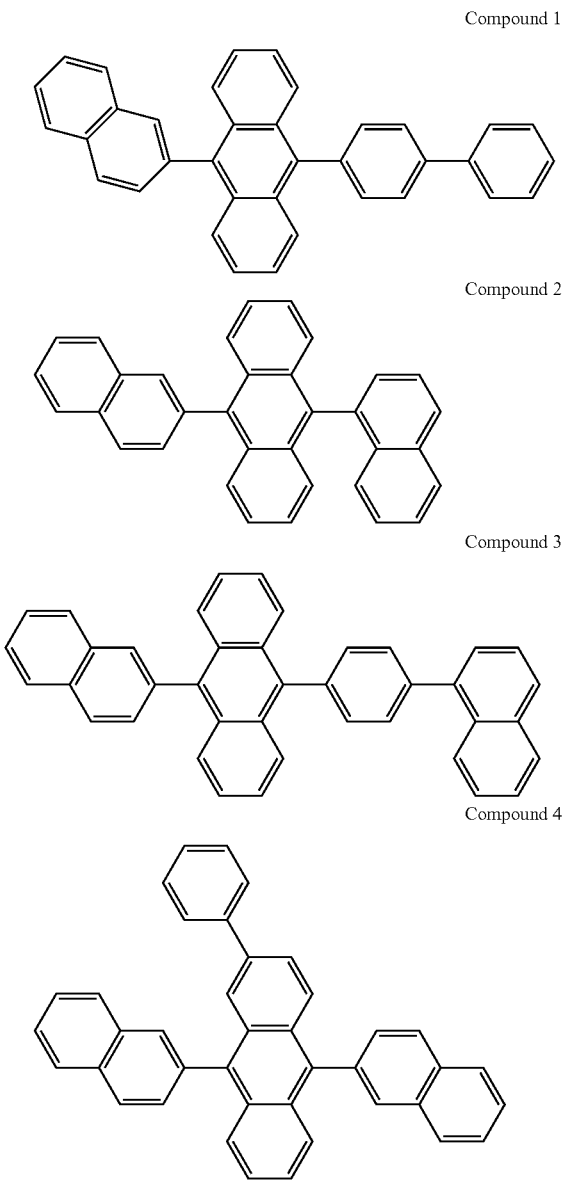

In particular, the red organic electroluminescent element 3R (or green organic electroluminescent element 3G) can have a configuration in which electrons are not injected from the red light-emitting layer 13R (or green light-emitting layer 13G) into the blue light-emitting layer 13B easily. For example, it may be the case that each light-emitting layer is configured in such a way as to dispose an electron injection barrier between the red light-emitting layer 13R (or green light-emitting layer 13G) and the blue light-emitting layer 13B.

In the present embodiment, the blue light-emitting layer 13B is mentioned as an example of the common light-emitting layer, although not specifically limited to this. As for the common light-emitting layer, another color light-emitting layer, e.g., a green light-emitting layer 13G or a red light-emitting layer 13R, may also be applied.

In the configuration of the present embodiment, the anode 11, the hole transportation layer 12, the light-emitting layer, the electron transportation layer 14, and the cathode 15 are stacked in that order from the substrate 10 side. However, conversely, the cathode 15, the electron transportation layer 14, the light-emitting layer, the hole transportation layer 12, and the anode 11 may be stacked in that order from the substrate 10 side.

The display apparatus according to aspects of the present invention may be a bottom emission type display apparatus in which the light of the organic electroluminescent element is emitted from the substrate 10 side, or be a top emission type display apparatus in which the light of the organic electroluminescent element is emitted from the side opposite to the substrate 10.

Next, the individual members will be described concretely.

As for the substrate 10, for example, an insulating substrate made from glass, plastic, or the like and a silicon substrate may be used. In the substrate 10, switching elements, e.g., transistors and MIM elements, may be disposed on the above-described insulating substrate or the like. In that case, the substrate 10 may have a flattening film to flatten unevenness due to the switching elements.

As for the anode 11 and the cathode 15, for example, transparent oxide electrically conductive layers of tin oxide, indium oxide, indium tin oxide, indium zinc oxide, and the like and metal layers made from metal simple substances, e.g., Al, Ag, Cr, Ti, Mo, W, Au, Mg, and Cs, or alloys thereof may be used. Furthermore, the anode 11 and the cathode 15 may be formed from a stacked film of the transparent oxide electrically conductive layer and the metal layer or a stacked film of a plurality of metal layers.

The hole transportation layer 12 is formed from a single layer or a plurality of layers of an organic compound provided with a hole injection property and a hole transportation property. Meanwhile, the electron transportation layer 14 is formed from a single layer or a plurality of layers of an organic compound provided with an electron injection property and an electron transportation property. Optionally, in order to prevent movement of electrons from the light-emitting layer to the anode 11 side, an electron block layer may be disposed as the hole transportation layer 12. A hole block layer may be disposed as the electron transportation layer 14. An exciton block layer to suppress diffusion of excitons generated in the light-emitting layer may be disposed as the hole transportation layer 12 or the electron transportation layer 14. In this regard, the hole transportation layer 12 and the electron transportation layer 14 are not indispensable and may be omitted depending on the configuration of the organic electroluminescent element.

The material for the light-emitting layer is not specifically limited and a known material may be applied. The red light-emitting layer 13R and the green light-emitting layer 13G may be formed from only light-emitting materials or be a mixed layer of a light-emitting dopant material and a host material. Furthermore, an assist dopant material may be contained. In aspects of the present invention, the host material refers to a material having a largest content on a weight basis among the components in the light-emitting layer. The light-emitting material and the light-emitting dopant material may be either a fluorescent material or a phosphorescent material.

As for the insulating layer 20, resin materials, e.g., acrylic resins and polyimide resins, and inorganic materials, e.g., silicon nitride, may be used. Furthermore, a stacked film of the resin material and the inorganic material may also be used. The insulating layer 20 is not indispensable and may be omitted insofar as an occurrence of short-circuit between the anode 11 and the cathode 15 is prevented in the configuration.

As for the seal cap 30, a cap-shaped member of glass, plastic, or the like may be used. The seal cap 30 may be formed from, for example, a tabular member, e.g., a glass plate, and a sealing agent disposed around the display region 2 in order to bond the member and the substrate 10. A gas, e.g., nitrogen or argon, may be sealed into a space between the seal cap 30 and the cathode 15 of the organic electroluminescent element, or the space may be filled with a resin material, e.g., an acrylic resin.

Any configuration to seal the organic electroluminescent element may be employed. Regarding the configuration, in place of the seal cap 30, a seal film made from an inorganic material, e.g., silicon nitride, silicon oxide, or aluminum oxide, may be configured to be disposed on the cathode 15 of the organic electroluminescent element. The seal film may be formed from a stacked film of at least two layers of inorganic materials or be formed from a stacked film of an inorganic material and a resin material.

The display apparatus according to aspects of the present invention is used in display portions of television systems and personal computers. In addition, the display apparatus may be used in display portions and electronic viewfinders of image pickup apparatuses, e.g., digital cameras and digital video cameras. The image pickup apparatus further includes image pickup elements, e.g., an image pickup optical system and a CMOS sensor, to pick up an image.

The display apparatus according to the present embodiment may be used in a display portion of a cellular phone, a display portion of a hand-held video game machine, and the like and, furthermore, be used in a display portion of a portable music player, a display portion of a personal digital assistant (PDA), and a display portion of a car navigation system.

Figure 3:
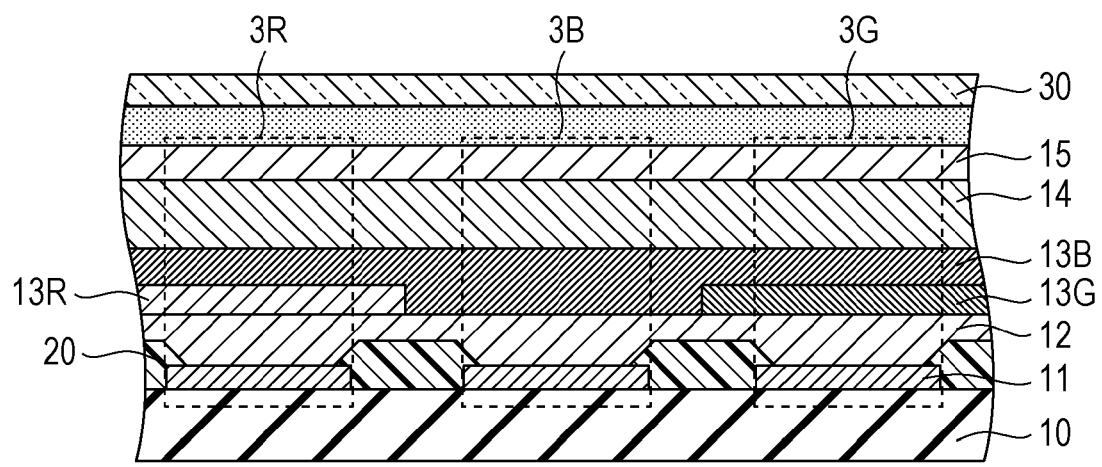
FIG. 3 is a schematic diagram showing an example of a display apparatus according to a second embodiment.

FIG. 3 is a schematic partial sectional diagram showing a second embodiment according to aspects of the present invention. The present embodiment is different from the first embodiment in that both the red light-emitting layer 13R and the green light-emitting layer 13G are disposed in the anode 11 side while being in contact with the blue light-emitting layer 13B. The present embodiment is different from the first embodiment in that the blue light-emitting layer 13B contains a host material and an assist dopant material to transport electrons to the light-emitting layers 13R and 13G. Furthermore, the present embodiment is different from the first embodiment in that the red organic electroluminescent element 3R (or green organic electroluminescent element 3G) is configured to satisfy Relational expressions (4) to (6) described below, $$|LUMO_1| < |B| \quad (4)$$

$$|LUMO_1| < |LUMO_2| \quad (5)$$

$$|LUMO_1| < |LUMO_a| < |B| + |LUMO_2| - |LUMO_1| \quad (6)$$

where $LUMO_1$ represents the lowest unoccupied molecular orbital (LUMO) level energy of the host material contained in the blue light-emitting layer 13B, $LUMO_a$ represents the LUMO level energy of the assist dopant material contained in the blue light-emitting layer 13B, $LUMO_2$ represents the LUMO level energy of the red light-emitting layer 13R (green light-emitting layer 13G), and B represents a work function of the cathode 15 in the case where the blue light-emitting layer 13B is in contact with the cathode 15 or the LUMO level energy of an organic compound layer in the case where the organic compound layer is disposed between the blue light-emitting layer 13B and the cathode 15 while being in contact with the blue light-emitting layer 13B.

More concretely, the red organic electroluminescent element 3R is configured to satisfy Relational expressions (4), (5)', and (6)' described below, and the green organic electroluminescent element 3G is configured to satisfy Relational expressions (4), (5)", and (6)" described below, $$|LUMO_1|<|B| \quad (4)$$

$$|LUMO_1|<|LUMO_{22}| \quad (5)'$$

$$|LUMO_1|<|LUMO_a|<|B|+|LUMO_{22}|-|LUMO_1| \quad (6)'$$

$$|LUMO_1|<|LUMO_{23}| \quad (5)''$$

$$|LUMO_1|<|LUMO_a|<|B|+|LUMO_{23}|-|LUMO_1| \quad (6)''$$

where $LUMO_{22}$ represents the LUMO level energy of the red light-emitting layer 13R, and $LUMO_{23}$ represents the LUMO level energy of the green light-emitting layer 13G.

The LUMO level energy of the red light-emitting layer 13R (or green light-emitting layer 13G) refers to the LUMO level energy having a largest absolute value among the LUMO level energy of materials contained in the red light-emitting layer 13R (or green light-emitting layer 13G). For example, in the case where the red light-emitting layer 13R (or green light-emitting layer 13G) is made from only a light-emitting material, the LUMO level energy of the light-emitting material applies. In the case where the red light-emitting layer 13R (or green light-emitting layer 13G) is made from a host material and a light-emitting dopant material, the LUMO level energy of the red light-emitting layer 13R (or green light-emitting layer 13G) is the LUMO level energy of the host material or the LUMO level energy of the light-emitting dopant material, whichever has a larger absolute value. In the case where the organic compound layer is made from only one material, the LUMO level energy of the organic compound layer refers to the LUMO level energy of the material concerned. In the case where the organic compound layer is made from at least two materials, the LUMO level energy of the organic compound layer refers to the LUMO level energy of the material having the largest content.

Figure 4A:
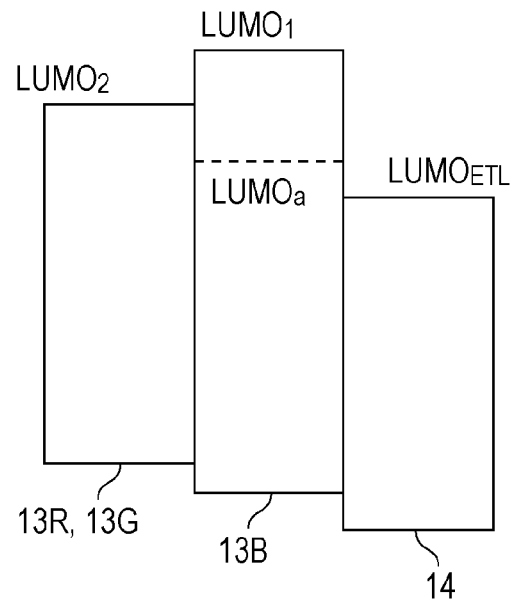
FIGS. 4A and 4B are schematic diagrams showing energy bands of the individual light-emitting layers according to the second embodiment.
Figure 4B:
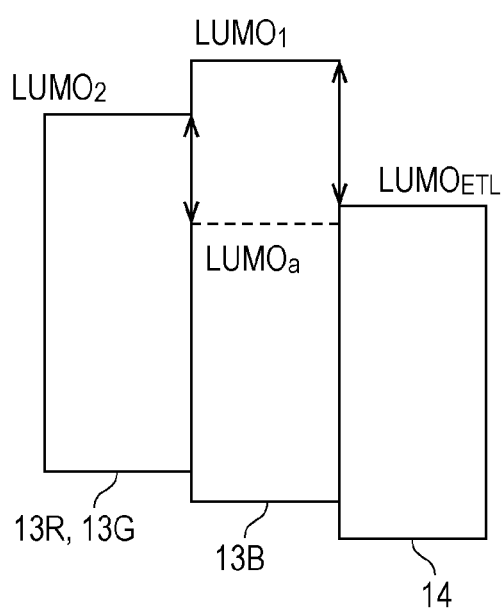

Relational expressions (4) to (6) described above will be explained with reference to FIGS. 4A and 4B. FIGS. 4A and 4B show energy bands of the blue light-emitting layer 13B and the red light-emitting layer 13R (or green light-emitting layer 13G) satisfying Relational expressions (4) to (6). FIGS. 4A and 4B show the case where an electron transportation layer 14 is disposed between the blue light-emitting layer 13B and the cathode 15 while being in contact with the blue light-emitting layer 13B, and B is specified to be $LUMO_{ETL}$.

In order that the red organic electroluminescent element 3R (or green organic electroluminescent element 3G) emits light efficiently, it may be necessary that holes and electrons are injected into the red light-emitting layer 13R (or green light-emitting layer 13G) efficiently. Here, consideration is given to the case where the absolute value of the LUMO level energy of the blue light-emitting layer 13B is smaller than the absolute value of the LUMO level energy of the electron transportation layer 14 and the absolute value of the LUMO level energy of the red light-emitting layer 13R (or green light-emitting layer 13G), as shown in FIG. 4A ($|LUMO_1|<|B|$, $|LUMO_1|<|LUMO_2|$). In this case, an electron injection barrier (difference in LUMO level energy between the blue light-emitting layer 13B and the electron transportation layer 14) occurs at the interface between the blue light-emitting layer 13B and the electron transportation layer 14, so that electrons are not injected into the blue light-emitting layer 13B easily. As a result, electrons are not injected into the red light-emitting layer 13R (or green light-emitting layer 13G) easily by being transported through the blue light-emitting layer 13B. Consequently, the red organic electroluminescent element 3R (or green organic electroluminescent element 3G) does not emit light efficiently.

Meanwhile, in the case where the assist dopant material to transport electrons is mixed into the blue light-emitting layer 13B, electrons are injected at the LUMO level of the assist dopant material of the blue light-emitting layer 13B, and are injected into the red light-emitting layer 13R (or green light-emitting layer 13G) from that level. As a result, the red organic electroluminescent element 3R (or green organic electroluminescent element 3G) emits light efficiently.

Consequently, it may be necessary that the absolute value of the LUMO level energy of the assist dopant material is larger than the absolute value of the LUMO level energy of the host material of the blue light-emitting layer 13B.

Therefore, it may be necessary that $$|LUMO_a|>|LUMO_1| \quad (6A)$$

is satisfied.

Meanwhile, as shown in FIG. 4B, the absolute value of the LUMO level energy of the assist dopant material may be larger than the absolute value of the LUMO level energy of the electron transportation layer 14. However, it may be necessary that electrons injected at the LUMO level of the assist dopant material cross the electron injection barrier described below in order to be injected at the LUMO level of the red light-emitting layer 13R (or green light-emitting layer 13G). This electron injection barrier is represented by a difference in LUMO level energy between the assist dopant material and the red light-emitting layer 13R (or green light-emitting layer 13G). If this electron injection barrier is larger than the electron injection barrier represented by the originally expected difference in LUMO level energy between the blue light-emitting layer 13B and the electron transportation layer 14, it is not possible to obtain an effect by mixing the assist dopant material. Therefore, it may be necessary that the difference in LUMO level energy between the assist dopant material and the red light-emitting layer 13R (or green light-emitting layer 13G) is smaller than the difference in LUMO level energy between the blue light-emitting layer 13B and the electron transportation layer 14. Consequently, it may be necessary that $$|LUMO_a|-|LUMO_2|<|LUMO_1|-|B| \quad (6B)$$

is satisfied.

Then, Relational expression (6) is derived from Formula (6A) and Formula (6B) described above.

As described above, the performance of injection of electrons into the red light-emitting layer 13R (or green light-emitting layer 13G) is improved by the common light-emitting layer (blue light-emitting layer 13B) and the red light-emitting layer 13R (or green light-emitting layer 13G) satisfying Relational expressions (4) to (6) described above. As a result, the probability of recombination of holes and electrons in the red light-emitting layer 13R (or green light-emitting layer 13G) increases and the organic electroluminescent elements 3R and 3G are allowed to emit light efficiently through the use of the recombination energy. In this regard, in the red organic electroluminescent element 3R and the green organic electroluminescent element 3G, the common light-emitting layer does not emit light in spite of being called a common light-emitting layer. That is, in the red organic electroluminescent element 3R, only the red light-emitting layer 13R emits light and in the green organic electroluminescent element 3G, only the green light-emitting layer 13G emits light. In aspects of the present invention, the term "do not emit light" refers to emit completely no light or emit light having intensity only at a level at which the intensity is not visually identified.

The blue light-emitting layer 13B according to the present embodiment contains a blue light emitting dopant material besides the host material and the assist dopant material. The light emitting dopant material may be 10 percent by weight or less in the components contained in the blue light-emitting layer 13B. This is because if the concentration of the light emitting dopant material is more than 10 percent by weight, the luminous efficacy may be reduced on the basis of concentration quenching. In order to transport electrons efficiently, the concentration of the assist dopant material can be larger than the concentration of the light-emitting dopant material and be smaller than the concentration of the host material. More concretely, the concentration of the assist dopant material is 15 percent by weight or more and 45 percent by weight or less, such as 25 percent by weight or more and 45 percent by weight or less.

In particular, the red organic electroluminescent element 3R (or green organic electroluminescent element 3G) can has a configuration in which holes are not injected from the red light-emitting layer 13R (or green light-emitting layer 13G) into the blue light-emitting layer 13B easily. For example, it may be the case that each light-emitting layer is configured in such a way as to dispose a hole injection barrier between the red light-emitting layer 13R (or green light-emitting layer 13G) and the blue light-emitting layer 13B.

In the present embodiment, the blue light-emitting layer 13B is mentioned as an example of the common light-emitting layer, although not specifically limited to this. As for the common light-emitting layer, another color light-emitting layer, e.g., a green light-emitting layer 13G or a red light-emitting layer 13R, may also be applied.

In the present embodiment, the anode 11, the hole transportation layer 12, the light-emitting layer, the electron transportation layer 14, and the cathode 15 are stacked in that order from the substrate 10 side. However, a reverse configuration may be employed.

The display apparatus according to aspects of the present invention may be a bottom emission type display apparatus in which the light of the organic electroluminescent element is emitted from the substrate 10 side, or be a top emission type display apparatus in which the light of the organic electroluminescent element is emitted from the side opposite to the substrate 10.

Figure 5:
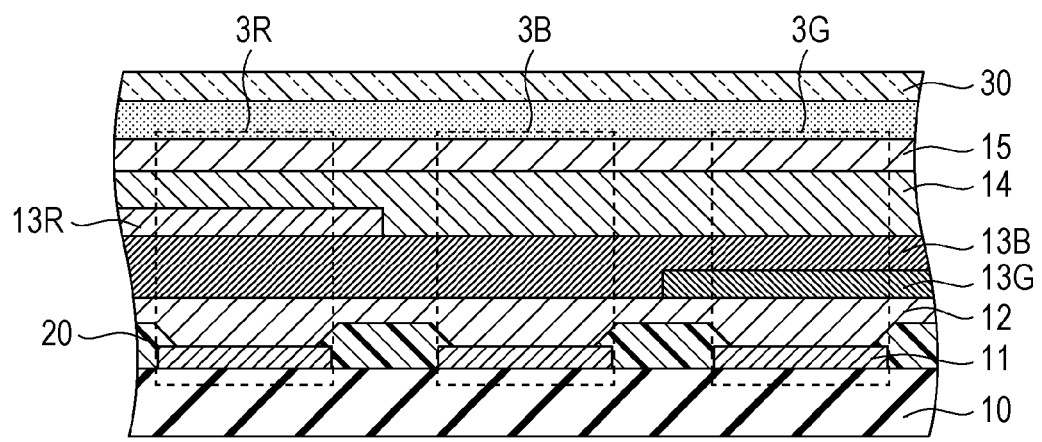
FIG. 5 is a schematic diagram showing an example of a display apparatus according to a third embodiment.

FIG. 5 is a schematic partial sectional diagram showing a third embodiment according to aspects of the present invention. The present embodiment is different from the first embodiment in that the green light-emitting layer 13G is disposed in the anode 11 side while being in contact with the blue light-emitting layer 13B. In the present embodiment, the blue light-emitting layer 13B contains at least one of a hole transportation assist dopant material to transport holes to the red light-emitting layer 13R and an electron transportation assist dopant material to transport electrons to the green light-emitting layer 13G besides the host material. Furthermore, in the case where the blue light-emitting layer 13B contains the hole transportation assist dopant material to transport holes to the red light-emitting layer 13R, the blue light-emitting layer 13B and the red light-emitting layer 13R are configured to satisfy Relational expressions (1) to (3) described above. In the case where the blue light-emitting layer 13B contains the electron transportation assist dopant material to transport electrons to the green light-emitting layer 13G, the blue light-emitting layer 13B and the green light-emitting layer 13G are configured to satisfy Relational expressions (4) to (6) described above.

In this regard, the term "$HOMO_a$" in Relational expression (1) and (3) is deemed to be replaced with the term "HOMO level energy of the hole transportation assist dopant material to transport holes to the red light-emitting layer 13R". Likewise, the term "$LUMO_a$" in Relational expression (4) and (6) is deemed to be replaced with the term "LUMO level energy of the electron transportation assist dopant material to transport electrons to the green light-emitting layer 13G".

In the case where such a configuration is employed, optionally, regarding the red organic electroluminescent element 3R, the performance of injection of holes from the blue light-emitting layer 13B into the red light-emitting layer 13R is improved, or regarding the green organic electroluminescent element 3G, the performance of injection of electrons from the blue light-emitting layer 13B into the green light-emitting layer 13G is improved. Consequently, the red organic electroluminescent element 3R and the green organic electroluminescent element 3G are allowed to emit light efficiently.

The blue light-emitting layer 13B may contain both the hole transportation assist dopant material and the electron transportation assist dopant material. In this case, the hole transportation assist dopant material and the electron transportation assist dopant material may be the same material or different materials.

The present embodiment shows the example in which the red light-emitting layer 13R is disposed in the cathode 15 side while being in contact with the blue light-emitting layer 13B and the green light-emitting layer 13G is disposed in the anode 11 side while being in contact with the blue light-emitting layer 13B, although a reverse configuration may be employed. That is, the red light-emitting layer 13R may be disposed in the anode 11 side while being in contact with the blue light-emitting layer 13B and the green light-emitting layer 13G is disposed in the cathode 15 side while being in contact with the blue light-emitting layer 13B. In this case, the blue light-emitting layer 13B and the red light-emitting layer 13R are configured to satisfy Relational expressions (4) to (6) described above, and the blue light-emitting layer 13B and the green light-emitting layer 13G are configured to satisfy Relational expressions (1) to (3) described above.

In the present embodiment, the blue light-emitting layer 13B is mentioned as an example of the common light-emitting layer, although not specifically limited to this. As for the common light-emitting layer, another color light-emitting layer, e.g., a green light-emitting layer 13G or a red light-emitting layer 13R, may also be applied.

In the present embodiment, the anode 11, the hole transportation layer 12, the light-emitting layer, the electron transportation layer 14, and the cathode 15 are stacked in that order from the substrate 10 side. However, a reverse configuration may be employed.

The display apparatus according to aspects of the present invention may be a bottom emission type display apparatus in which the light of the organic electroluminescent element is emitted from the substrate 10 side, or be a top emission type display apparatus in which the light of the organic electroluminescent element is emitted from the side opposite to the substrate 10.

EXAMPLES

In the present example, the highest occupied molecular orbital (HOMO) level energy was measured by using photoelectron spectroscopy (measurement instrument name AC-2, produced by RIKEN KIKI CO., LTD.) in the air. The lowest unoccupied molecular orbital (LUMO) level energy was calculated by subtracting the band gap, which was determined from an absorption edge of a spectrum measured by using ultraviolet and visible spectroscopy (UV/VIS V-560, produced by JASCO Corporation), from the HOMO level energy.

Example 1

A display apparatus having the configuration shown in FIGS. 1A and 1B was produced. The present example corresponded to the first embodiment. The present example was a top emission type display apparatus in which the light was taken from the surface opposite to the substrate 10.

A low-temperature polysilicon thin film transistor (TFT) was formed on a glass substrate, and an interlayer insulating film made from silicon nitride and a flattening film made from an acrylic resin were formed thereon, so that the substrate 10 shown in FIG. 1A was produced. After an aluminum alloy film having a thickness of 200 nm was formed on the resulting substrate 10, an ITO film having a thickness of 20 nm was formed. Subsequently, the aluminum alloy and the ITO film were patterned on a pixel basis, so as to form an anode 11.

An acrylic resin was formed on the anode 11 through spin coating, and the acrylic resin was patterned through lithography, so as to form an insulating layer 20. Ultrasonic cleaning with isopropyl alcohol (IPA) was performed, and cleaning through boiling was performed, followed by drying. Furthermore, UV/ozone cleaning was performed and, thereafter, an organic compound layer described below was formed by a vacuum evaporation method under the following configuration.

Initially, Compound 1 having a thickness of 60 nm was evaporated all over the display region 2, so as to form a common hole transportation layer 12. The HOMO level energy of Compound 5 was 5.30 eV.

Compound 5

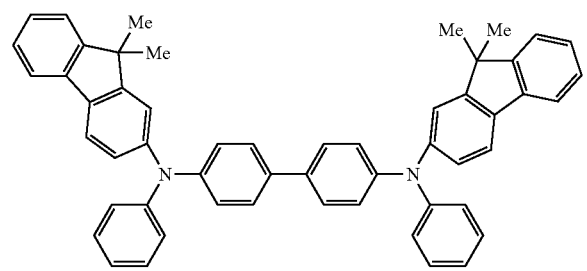

Subsequently, a host material represented by Compound 1, an assist dopant material represented by Compound 6, and a blue light emitting dopant material Represented by Compound 7 were co-evaporated (volume ratio 69:30:1) on the hole transportation layer 12, so as to form the blue light-emitting layer 13B having a film thickness of 20 nm all over the display region 2. The HOMO level energy of Compound 1 and Compound 6 were 5.86 eV and 5.68 eV, respectively.

Compound 6

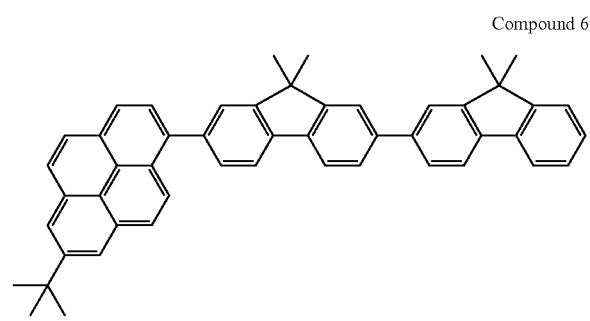

Compound 7

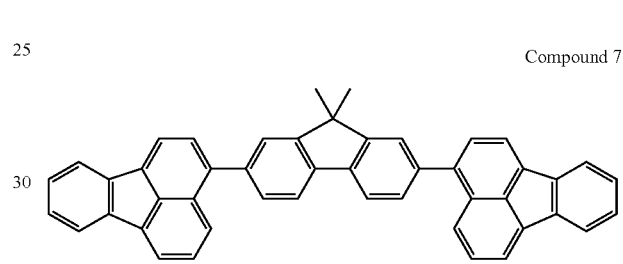

Then, a host material represented by Compound 8 and a red light emitting dopant material represented by Compound 9 were co-evaporated (volume ratio 99:1) at a position corresponding to the pixel of the red organic electroluminescent element 3R, so as to form the red light-emitting layer 13R having a film thickness of 20 nm by using a mask. Likewise, a host material represented by Compound 10 and a green light emitting dopant material represented by Compound 11 were co-evaporated (volume ratio 95:5) at a position corresponding to the pixel of the green organic electroluminescent element 3G, so as to form the green light-emitting layer 13G having a film thickness of 20 nm by using a mask.

The HOMO level energy of Compound 8 was 5.50 eV. The HOMO level energy of Compound 10 was 5.72 eV.

Compound 8

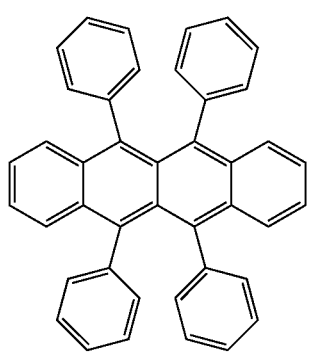

Compound 9

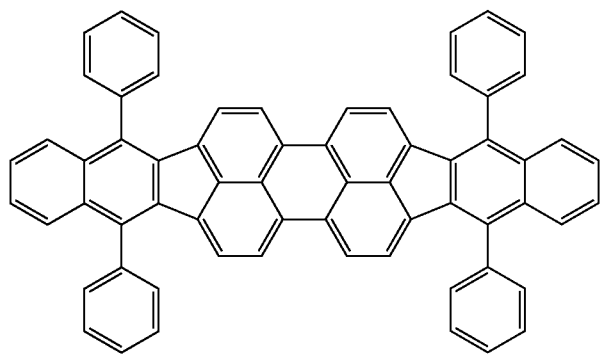

Compound 10

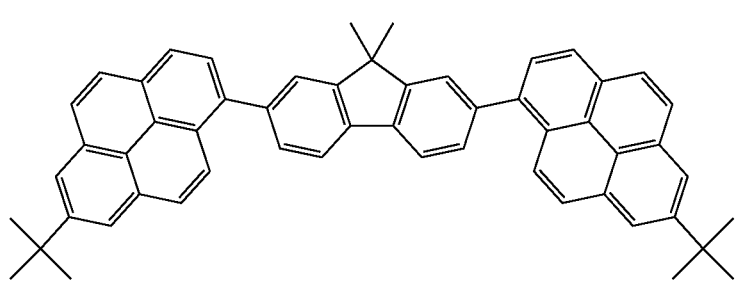

Compound 11

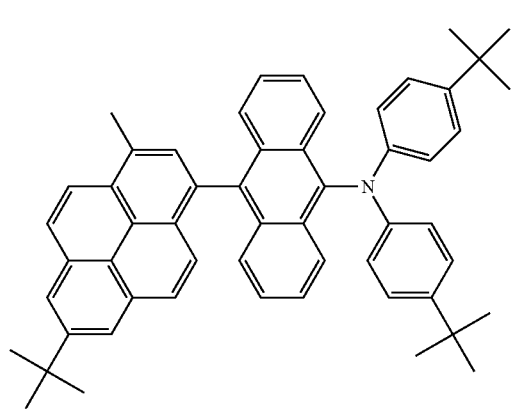

Next, Compound 12 having a thickness of 10 nm was evaporated all over the display region 2, so as to form a common hole block layer (not shown in the drawing). Subsequently, Compound 13 having a thickness of 30 nm was evaporated all over the display region 2, so as to form a common electron transportation layer 14.

Compound 12

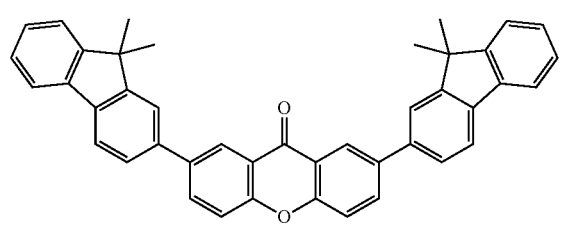

-continued

Compound 13

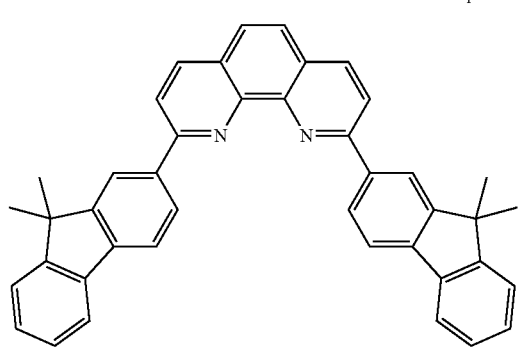

Then, a magnesium metal and a silver metal were co-evaporated all over the display region 2, so as to form a film of the cathode 15 having a film thickness of 20 nm. Finally, the whole display region 2 was sealed with a seal cap 30 including a desiccant in a glove box in a nitrogen atmosphere.

Regarding the red organic electroluminescent element 3R, $|HOMO_1|=5.86$ eV, $|HOMO_a|=5.68$ eV, $|A|=5.30$ eV, and $|HOMO_2|=5.50$ eV were obtained, so that Relational expressions (1) to (3) were satisfied. Regarding the blue organic electroluminescent element 3B, $|HOMO_1|=5.86$ eV, $|HOMO_a|=5.68$ eV, $|A|=5.30$ eV, and $|HOMO_2|=5.72$ eV were obtained, so that Relational expressions (1) to (3) were satisfied.

The characteristics of the thus obtained display apparatus were evaluated. When a predetermined current was passed through each of the pixels, the red organic electroluminescent element 3R, the green organic electroluminescent element 3G, and the blue organic electroluminescent element 3B exhibited good light emission characteristics of red light emission, green light emission, and blue light emission, respectively.

Example 2

The present example was different from Example 1 in the configuration of the green light-emitting layer 13G. Concretely, the same material as the assist dopant material, which was contained in the blue light-emitting layer 13B, that is, the material represented by Compound 6, was used as the host material of the green light-emitting layer 13G. A display apparatus having the same configuration as that in Example 1 was produced except the above-described configuration.

In this case, regarding the blue organic electroluminescent element 3B, $|HOMO_1|=5.86$ eV, $|HOMO_a|=5.68$ eV, $|A|=5.30$ eV, and $|HOMO_2|=5.68$ eV were obtained, so that Relational expressions (1) to (3) were satisfied.

The characteristics of the thus obtained display apparatus were evaluated. When a predetermined current was passed through each of the pixels, the red organic electroluminescent element 3R, the green organic electroluminescent element 3G, and the blue organic electroluminescent element 3B exhibited good light emission characteristics of red light emission, green light emission, and blue light emission, respectively.

Comparative Example 1

The present comparative example was different from Example 1 in that the blue light-emitting layer 13B was formed through co-evaporation of the host material represented by Compound 1 and the blue light-emitting dopant material represented by Compound 7 at a volume ratio of 99:1 and, therefore, an assist dopant material was not contained. A display apparatus having the same configuration as that in Example 1 was produced except the above-described configuration.

The characteristics of the thus obtained display apparatus were evaluated. When a predetermined current was passed through each of the pixels, the blue organic electroluminescent element 3B exhibited good light emission characteristics of blue light emission. However, regarding the red organic electroluminescent element 3R and the green organic electroluminescent element 3G, the light output power was small and insufficient light emission characteristics were exhibited where a monochromatic red light emission characteristic and a monochromatic green light emission characteristic were not obtained, but a blue light emission component was mixed in each characteristic.

Example 3

A display apparatus provided with the organic electroluminescent element having the configuration shown in FIG. 3 was produced. The present example was different from Example 1 in the point that the red light-emitting layer 13R and the green light-emitting layer 13G were disposed in the anode 11 side of the blue light-emitting layer 13B and in the configuration of the blue light-emitting layer 13B. Only portions different from Example 1 will be described below.

In the present example, a red light-emitting layer 13R having the same configuration as that in Example 1 and a green light-emitting layer 13G having the following structure were formed after the hole transportation layer 12 was formed and before the blue light-emitting layer 13B were formed. The green light-emitting layer 13G having a film thickness of 20 nm was formed through co-evaporation (volume ratio of 95:5) of the host material represented by Compound 4 and the green light-emitting dopant material represented by Compound 11. The LUMO level energy of Compound 8 was 2.96 eV, and the LUMO level energy of Compound 4 was 3.04 eV.

A host material represented by Compound 6, an assist dopant material represented by Compound 14, and a blue light emitting dopant material Represented by Compound 15 were co-evaporated (volume ratio 65:30:5) thereon, so as to form the blue light-emitting layer 13B having a film thickness of 20 nm all over the display region 2. The LUMO level energy of Compound 6 and Compound 14 were 2.74 eV and 3.01 eV, respectively.

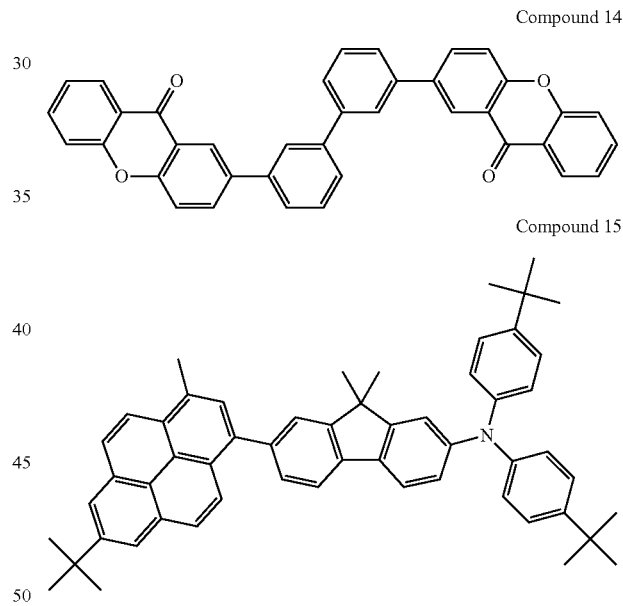

Compound 14

Compound 15

The LUMO level energy of Compound 10 used for the hole block layer, which was in contact with the cathode 15 side of the blue light-emitting layer 13B, was 3.09 eV.

Regarding the red organic electroluminescent element 3R, $|LUMO_1|=2.74$ eV, $|LUMO_a|=3.01$ eV, $|B|=3.09$ eV, and $|LUMO_2|=2.96$ eV were obtained, so that Relational expressions (4) to (6) were satisfied. Regarding the green organic electroluminescent element 3G, $|LUMO_1|=2.74$ eV, $|LUMO_a|=3.01$ eV, $|B|=3.09$ eV, and $|LUMO_2|=3.04$ eV were obtained, so that Relational expressions (4) to (6) were satisfied.

The characteristics of the thus obtained display apparatus were evaluated. When a predetermined current was passed through each of the pixels, the red organic electroluminescent element 3R, the green organic electroluminescent element 3G, and the blue organic electroluminescent element 3B exhibited good light emission characteristics of red light emission, green light emission, and blue light emission, respectively.

Comparative Example 2

The present comparative example was different from Example 1 in that the blue light-emitting layer 13B was formed through co-evaporation of the host material represented by Compound 1 and the blue light-emitting dopant material represented by Compound 7 at a volume ratio of 99:1 and, therefore, an assist dopant material was not contained. A display apparatus having the same configuration as that in Example 3 was produced except the above-described configuration.

The characteristics of the thus obtained display apparatus were evaluated. When a predetermined current was passed through each of the pixels, the blue organic electroluminescent element 3B exhibited good light emission characteristics of blue light emission. However, regarding the red organic electroluminescent element 3R and the green organic electroluminescent element 3G, the light output power was small and insufficient light emission characteristics were exhibited where a monochromatic red light emission characteristic and a monochromatic green light emission characteristic were not obtained, but a blue light emission component was mixed in each characteristic.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-189132 filed Aug. 31, 2011, which is hereby incorporated by reference herein in its entirety.

What is claimed is:

1. A display apparatus comprising:
   a first organic electroluminescent element to emit a first color; and
   a second organic electroluminescent element to emit a second color different from the first color,
   both the first and the second organic electroluminescent elements being provided with an anode, a cathode, and a light-emitting layer disposed between the anode and the cathode,
   wherein a first light-emitting layer of the first organic electroluminescent element is disposed in common to the second organic electroluminescent element,
   a second light-emitting layer of the second organic electroluminescent element is disposed in contact with the first light-emitting layer and in the side nearer to the cathode than is the first light-emitting layer,
   the first light-emitting layer contains a host material and an assist dopant material to transport holes to the second light-emitting layer, and
   the second organic electroluminescent element is configured to satisfy Relational expressions (1) to (3) described below, $$|HOMO_1| > |A| \qquad (1)$$

$$|HOMO_1| > |HOMO_2| \qquad (2)$$

$$|A| + |HOMO_2| - |HOMO_1| < |HOMO_a| < |HOMO_1| \qquad (3)$$

where $HOMO_1$ represents the HOMO level energy of the host material contained in the first light-emitting layer, $HOMO_a$ represents the HOMO level energy of the assist dopant material contained in the first light-emitting layer, $HOMO_2$ represents the HOMO level energy of the second light-emitting layer, and A represents a work function of the anode in the case where the first light-emitting layer is in contact with the anode or the HOMO level energy of an organic compound layer in the case where the organic compound layer is disposed between the first light-emitting layer and the anode while being in contact with the first light-emitting layer.

2. The display apparatus according to claim 1, wherein in the second organic electroluminescent element, only the second light-emitting layer emits light.

3. The display apparatus according to claim 1, wherein the first light-emitting layer emits blue light.

4. The display apparatus according to claim 3, wherein the content of the assist dopant material in the first light-emitting layer is 15 percent by weight or more and 45 percent by weight or less.

5. The display apparatus according to claim 3, wherein the first light-emitting layer further comprises a light-emitting dopant material and the content of the light-emitting dopant material is 10 percent by weight or less.

6. The display apparatus according to claim 3, wherein an anthracene derivative is used as the host material of the first light-emitting layer.

7. The display apparatus according to claim 6, wherein the anthracene derivative has at least one of structures represented by the structural formulae described below in a skeleton

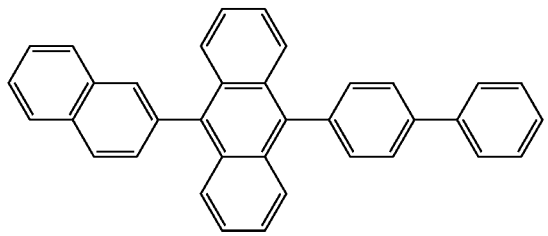

Compound 1

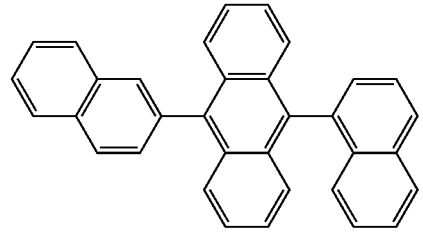

Compound 2

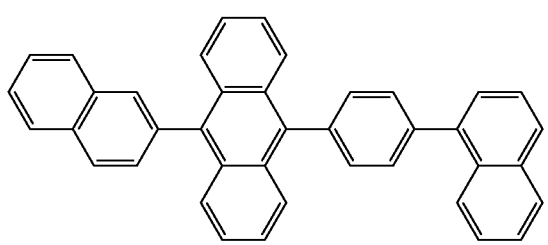

Compound 3

Compound 4

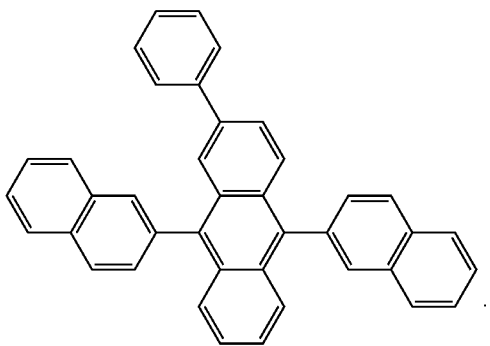

8. The display apparatus according to claim 1, further comprising a third organic electroluminescent element to emit a third color different from the first color and the second color,
wherein the first light-emitting layer is disposed in common to the third organic electroluminescent element as well, and
a third light-emitting layer of the third organic electroluminescent element is disposed in contact with the first light-emitting layer and in the side nearer to the cathode than is the first light-emitting layer.

9. The display apparatus according to claim 8, wherein the third organic electroluminescent element is configured to satisfy Relational expressions (1), (2)", and (3)" described below, $$|HOMO_1| > |A| \quad (1)''$$

$$|HOMO_1| > |HOMO_{23}| \quad (2)''$$

$$|A| + |HOMO_{23}| - |HOMO_1| < |HOMO_a| < |HOMO_1| \quad (3)''$$

where $HOMO_{23}$ represents the HOMO level energy of the third light-emitting layer.

10. The display apparatus according to claim 8, wherein in the third organic electroluminescent element, only the third light-emitting layer emits light.

11. The display apparatus according to claim 8, wherein the first light-emitting layer emits blue light, the second light-emitting layer emits red light, and the third light-emitting layer emits green light.

12. The display apparatus according to claim 1, further comprising a third organic electroluminescent element to emit a third color different from the first color and the second color,
wherein the first light-emitting layer is disposed in common to the third organic electroluminescent element as well, and
a third light-emitting layer of the third organic electroluminescent element is disposed in contact with the first light-emitting layer and in the side nearer to the anode than is the first light-emitting layer.

13. The display apparatus according to claim 12, wherein the third organic electroluminescent element is configured to satisfy Relational expressions (4), (5)", and (6)" described below, $$|LUMO_1| < |B| \quad (4)$$

$$|LUMO_1| < |LUMO_{23}| \quad (5)''$$

$$|LUMO_1| < |LUMO_a| < |B| + |LUMO_{23}| - |LUMO_1| \quad (6)''$$

$$|LUMO_1| < |LUMO_{23}| \quad (5)''$$

$$|LUMO_1| < |LUMO_a| < |B| + |LUMO_{23}| - |LUMO_1| \quad (6)''$$

where $LUMO_1$ represents the LUMO level energy of the host material contained in the first light-emitting layer, $LUMO_a$ represents the LUMO level energy of the assist dopant material contained in the first light-emitting layer, $LUMO_{23}$ represents the LUMO level energy of the third light-emitting layer, and B represents a work function of the cathode in the case where the first light-emitting layer is in contact with the cathode or the LUMO level energy of an organic compound layer in the case where the organic compound layer is disposed between the first light-emitting layer and the cathode while being in contact with the first light-emitting layer.

14. An image pickup apparatus comprising the display apparatus according to claim 1 and an image pickup element.

* * * * *